United States Patent

Aksay et al.

[11] Patent Number: 5,869,432
[45] Date of Patent: Feb. 9, 1999

[54] METHOD FOR PRODUCING CERAMIC SUPERCONDUCTOR SINGLE CRYSTALS

[75] Inventors: Ilhan A. Aksay; Edward P. Vicenzi, both of Princeton; David L. Milius, Cranbury, all of N.J.; John S. Lettow, Somerville, Mass.

[73] Assignee: The Trustees of Princeton University, Princeton, N.J.

[21] Appl. No.: 773,109

[22] Filed: Dec. 26, 1996

[51] Int. Cl.⁶ ........................................... H01B 12/00
[52] U.S. Cl. ..................... 505/450; 505/490; 505/441; 505/452; 505/470; 505/230; 505/231; 505/232
[58] Field of Search .................. 505/450, 490, 505/441, 452, 470, 231, 230, 232

[56] References Cited

U.S. PATENT DOCUMENTS

| | | |
|---|---|---|
| 5,304,534 | 4/1994 | Ciszek ........................ 505/434 |
| 5,395,820 | 3/1995 | Murakami et al. ............ 505/126 |
| 5,474,976 | 12/1995 | Kondoh et al. .............. 505/450 |
| 5,496,799 | 3/1996 | Yoshida et al. .............. 505/450 |
| 5,547,921 | 8/1996 | Tani et al. .................. 505/124 |
| 5,652,199 | 7/1997 | Isawa et al. ................ 505/441 |

*Primary Examiner*—Robert Kunemund
*Attorney, Agent, or Firm*—Woodbridge & Associates

[57] ABSTRACT

A bulk high temperature superconductor single crystal having the formula $MBa_2Cu_3O_{7-x}$ wherein M is selected from the group consisting of Y, Sm, Eu, Gd, Dy, Ho, Er, and Yb; and, x has a number value from about 0.1 to about 1.0; are produced by a novel process incorporating: i) starting powders produced by combustion spray pyrolysis, ii) a novel setter powder, and/or iii) a monitored isothermal growth process.

15 Claims, No Drawings

METHOD FOR PRODUCING CERAMIC SUPERCONDUCTOR SINGLE CRYSTALS

This invention was made with government support under contract number F49620-93-1 awarded by the U.S. Air Force. The government has certain rights in this invention.

BACKGROUND

Continuing scientific and technological advances in the area of high-temperature superconducting ceramic (HTSC) materials are expected to have a significant economic impact in the next century. Numerous applications involving the use of these materials as thin and thick films, in wire form, and in bulk form are being explored. Applications based on HTSC thin films—e.g., filters for advanced communications systems, probe coils for magnetic resonance systems, and squids for non-destructive evaluation (NDE) and biomagnetism instruments—are progressing the most rapidly because thin films possess the necessary high current-carrying capacity. In contrast, applications requiring bulk superconductors have advanced at a slower pace because bulk materials having high critical current density are difficult to process. Only with significant increases in critical current density and the development of economically viable processing methods will the many potential applications of bulk HTSC materials be realized. These applications include bearings for superconducting motors, rails for magnetic levitation systems, components for high-efficiency generators, electromagnetic pumping, magnetic heat pumps, magnetic separation, and many other special-purpose devices. Early developmental work involving the use of bulk HTSC materials in an experimental generator, superconducting flywheel for long-term energy storage, and in high-temperature superconducting bearings have recently been reported.

For most applications requiring bulk HTSC material, the flux-trapping capacity is of primary importance in determining its utility, particularly when the material is to be used as a permanent magnet. To achieve a high flux-trapping capacity, the material must be able to carry a circulating current throughout the bulk form at high critical current density. In polycrystalline HTSC materials, achieving high critical current density is greatly inhibited by crystalline misalignments introduced at grain boundaries and the presence of other defects. For a given HTSC composition, the highest critical current density can thus be expected to occur in single crystals. The growth of high-quality superconducting single crystals, however, presents material processing challenges, both in fabricating required precursor materials and in optimizing the crystal growth process.

Specific targeted applications for these single crystals are superconducting clamping devices, electromagnetic superconductive dent pullers for use in the aircraft industry, bearings for flywheels, and advanced rivet guns. Even the simplest of these devices—an electromagnetic clamp— requires single crystals at least 3 cm in diameter able to trap a magnetic field of more than 1 T.

For most other applications, more stringent requirements must be met. Single crystals as large as 10 cm in diameter×2 cm thick and capable of trapping at least 3 T($J_c$>2400 A/cm$^2$) will be needed. Meeting this need will require significant advances in the materials and processes involved in producing HTSC single crystals, as well as an improved understanding of fundamental aspects of the overall crystal growth process.

Although the mechanisms for the peritectic reaction and growth of aligned grains in HTSC materials are well-documented, the growth of high-quality, large single crystals remains a challenging task. Early attempts to form bulk materials followed traditional ceramic processing methods such as the solid-state sintering of powder compacts containing appropriate mixtures of $Y_2O_3CuO_3$ and $BaCO_3$. Measured critical current densities were typically less than 1000 A/cm$^2$ and dropped off sharply in the presence of small magnetic fields (>0.5 T). Subsequent attempts involved the growth of 123 crystalline domains from a melt. As the superconducting 123 phase ($YBa_2Cu_3O_7$) is heated above its peritectic melting temperature of about 1010° C., it melts incongruently to form a non-superconducting 211 phase ($Y_2BaCuO_5$) and a liquid phase rich in barium and copper. When the two-phase mixture is cooled below the peritectic temperature, the 211 phase and the liquid phase react to form 123:

$$Y_2BaCUO_5 + [3\ BaCU_2 + 2\ CuO](liquid) \rightarrow YBa_2CU_3O_{7-x}$$

Other crystal growth processes rely on solid state reactions between Lanthanide, Ba, and Cu oxides to produce the starting materials. The solid state reaction of oxide powders to requires several heating and grinding steps before phase pure powders are obtained. The powders in other works are also frequently mixed with platinum by ball milling or with a mortar and pestle. Platinum also has been introduced using the melt-powder-melt-growth technique.

A number of processes for producing bulk material have been explored based on this melting and reaction behavior. Reported approaches include the melt-textured growth (MTG) process, the quench-melt-growth (QMG) process, and the melt-powder-melt-growth (MPMG) process. The MTG approach does not yield large crystals. In the other two processes, the starting powders are first melted at temperatures above the peritectic temperature in platinum crucibles, cooled or quenched, and then reheated under various conditions to HTSC. Aligned polycrystalline structures typically result. Although such process variations have demonstrated some ability to influence phase formation and distribution in the resulting materials, none of these approaches has resulted in high critical current densities and trapped fields in large samples. For example, materials produced by the MTG method were reported to have critical current values of up to 17,000 A/cm$^2$ in the absence of an applied magnetic field. Crystals as large as 8 cm in diameter have reportedly been grown by the MPMG process, and use of the process was claimed to be essential to such success.

Currently all single crystal growth processes slowly cool the sample, utilizing temperature and/or composition gradients to reduce the probability of nucleation away from the seed. While other processes require complex layering steps to make compacts with compositional gradients and/or the careful placement of a single sample in a specially designed furnace so that the temperature gradient in the furnace will align with the desired direction of growth in the sample.

Prior work has shown that high temperature ceramic superconductors as large as 8 cm in diameter can be grown by heating a pressed compact (usually in disk shape) of $YBa_2Cu_3O_7$ (123) powder above the $YBa_2Cu_3O_7 \rightarrow Y_2BaCuO(211)$+Liquid peritectic temperature of 1010° C. to achieve a homogeneous distribution of 211 particles within the liquid matrix and then nucleating the 123 crystal at a predetermined nucleation site of $SmBa_2Cu_3O_7$ seed crystal while the sample is slowly cooled below 1010° C. At a temperature range below 1010° C., the crystal growth is initiated and completed while the samples are cooled through this range at a cooling rate of 0.01° C./min. For a successful growth, platinum is added into the 123 powder compact in order to refine the 211 particles during the homogenization heat treatment above 1035° C. and a temperature gradient is introduced into the compact in order to prevent the nucleation of 123 anywhere else other than the $SmBa_2Cu_3O_7$ seed crystal.

Several problems associated with this process include: (i) the use of temperature gradient limits the number of samples that can be processed in a gradient furnace; (ii) continuous cooling limits the sample size to kinetically defined range; and (iii) samples lose considerable amount of liquid (>25 wt %) as a result of chemical reactions with the substrate and consequently the crystal growth is arrested after a critical amount of liquid is lost.

Another problem in growing single crystals is the difficulty of removing some samples from the MgO substrates. This demonstrates the importance of a suitable setter powder. Without an effective setter powder, separating the sample from the substrate is not only a processing nuisance but there is also risk of damaging the sample. Furthermore, the inert setter powder should not act as a nucleation site for the sample. This is important in the processing of single crystals and in inhibiting the nucleation of crystals away from the primary seed. Better setter powders are needed to facilitate bulk HTSC growth.

The ceramic powders used to make the HTSC materials can have a dramatic effect on the resulting product. Traditional multi-component ceramic powder processing usually relies upon solid-state reactions to produce powders having the desired final phase(s). The overall process typically involves wet or dry mixing and grinding of constituent powders as oxides or carbonates, followed by an appropriate calcination step to form the desired material. Due to the nonoptimal distribution of individual constituents within the batch, the resulting powder may be non-homogeneous and contain undesirable secondary phases and/or unreacted components. Repeated mixing/grinding and calcining steps are frequently required to achieve acceptable homogenization and phase-pure powders.

Various alternative powder processing methods have been developed for producing ceramic powders having greater compositional uniformity. Many of these techniques also yield much finer particles, which facilitate reactions and densification during sintering into useful components. One of these techniques is called spray pyrolysis. It consists of a solution/precipitation process much more amenable to process control than traditional solid-state powder processing methods. A detailed review of ceramic powder synthesis using this general approach has been provided by Messing et al., J.Am. Ceram. Soc. 76, p.2702 (1993). The process allows for the production of particles having controlled morphology, composition and reproducibility provided process variables are well understood.

SUMMARY

The present invention addresses the problems of single crystal growth in a number of ways (i) by utilizing a prereacted ceramic powder mixture prepared through a solution mixing CSP approach which can reduce the liquid drainage to significantly lower (<8 wt.) levels than the corresponding 30% loss noted with mechanically mixed powders. (ii) by utilizing a chemically inert setter powder to minimize liquid drainage to the setters, and (iii) by utilizing an isothermal heat treatment during crystal growth and thus making it possible to grow multiple number of samples in a single furnace without any restriction on size of the sample.

A significant improvement has been incorporated into the spray pyrolysis powder processing method used for fabricating a wide variety of complex ceramic materials, particularly HTSC compositions. Use of these materials provides unexpected improvements in the quality and yield of single crystals. After a stoichiometric solution of the appropriate metals, Ba, Cu, a lanthanide and Pt, is prepared an additional constituent—an organic fuel, e.g., sucrose—is added to the solution. After thorough mixing, the solution is atomized into fine droplets and rapidly dehydrated in a hot spray dryer chamber. As the droplets are dehydrated they decrease in size until they reach some critical size dependent on a number of process variables. Ignition of the organic fuel initiates an explosive exothermic reaction that generates additional energy for converting the metal salts to their respective oxides and/or carbonates while preserving the intimate mixing of the solution. All granules larger than a few tens of microns explosively combust and fine particles having a high degree of chemical homogeneity are produced. Calcination of the recovered "precursor" powder is then carried out to yield the desired powder product Novel setter powders are used to facilitate removal of the crystal from the substrate, reduce liquid loss, and to inhibit secondary crystallization sites.

The isothermal growth process of this invention can be used to grow multiple crystal samples in a single furnace without the requirement for temperature gradients or slow cooling. Crystals produced by the isothermal growth are not limited in size by the residence time at the growth temperature since the time spent at the isothermal growth process can be adjusted until a desired crystal size is reached. Crystal growth is monitored in a calibrated furnace. The isothermal growth process allows single crystal growth from a seed to reach large dimensions without inducing the homogeneous nucleation of secondary crystals form the melt, or cellular/dendritic crystal growth. The isothermal method of single crystal growth has several major advantages over the slow cooling techniques employed that often require the presence of a temperature gradient in the furnace. First, no modifications of the isothermal growth process are necessary to grow larger samples: the crystal simply needs to be held at the appropriate temperature for the amount of time required for it to grow to the desired size. In slow cooling processes, in order keep the crystal above a temperature at which homogeneous nucleation readily occurs, the cooling rate must be adjusted to match the size of the sample; larger samples require slower cooling rates. Second, because the isothermal growth process does not require a carefully controlled thermal gradient, as used in most slow cooling processes to suppress homogeneous nucleation, isothermal growth offers great potential for growing many samples during a single furnace run.

DESCRIPTION OF THE INVENTION

Many of the problems of growing high temperature superconducting materials, and especially single crystal materials, are addressed by the process of the present invention. A first embodiment of the new process uses novel ceramic powders produced using a combustion spray pyrolysis process as starting materials for the growth of HTSC. This combustion spray pyrolysis (CSP) process is disclosed in U.S. Pat. No. 5,061,682. The overall CSP process consists of four main steps: (1) solution preparation, which involves formulation of a metal/fuel solution of appropriate concentration and composition, (2) spray pyrolysis, which includes solution atomization, droplet dehydration, and fuel combustion to produce partially reacted precursor powders, (3) calcination, which involves reaction of the precursor powder constituents to form the desired final oxide composition(s), and (4) milling, which deagglomerates the calcined powders to yield a fine-particle product.

The high degree of molecular homogeneity and the precisely controlled stoichiometry make these powders well suited as starting materials for the growth of large HTSC single crystals. An advantage over previous CSP produced powders is the incorporation of a platinum source within the solution. Sources of barium, copper, and the lanthanide metals include, but are not limited to, their nitrates, oxides, organometallics such as formates and acetates, and carbonates. In order to improve the mixing in Y-123+Y-211+Pt powders for example, excess yttrium was included in the spray pyrolysis solution so as to form both Y-123 and Y-211 during pyrolysis. The platinum source can be Pt metal, $PtO_2$ hydrate or $PtCl_2$. Fuels are selected from carbohydrates including mono-, di-, and poly-saccharides, alcohols, PEG, PEO, PVA, and other combustable organics. For some YBCO samples, powders manufactured by combustion spray pyrolysis were obtained from Seatle Specialty Ceramics (currently known as Praxair Specialty Ceramics of Praxair Surface Technologies, Inc.).

The CSP produced YBCO powders were calcined at temperatures between 926° and 944° C. Samples grown with powders calcined at about 942° C. displayed significantly lower (<8 wt %) liquid losses during crystal growth. Differential thermal, X-ray diffraction and optical microscopic characterizations indicate that along with higher temperature calcination, platinum is reacted with the 123 and 211 particles and thus achieving a higher degree of homogeneity. Calcination was performed in a box furnace with bed depths of less than one inch in magnesia trays. Calcination temperatures for lanthanide-BCO powders are optimized to obtain a desirable balance between high phase purity and small particle size.

Powders containing platinum added as the metal or $PtO_2$ hydrate were indistinguishable in appearance from the other powders without Pt. For platinum containing powders fabricated using $PtCl_2$, however, the calcined powders were a bluish-green color rather than the normal black color.

A second embodiment of the present invention is a process for producing HTSC crystals in which the compact of starting materials is placed on a setting powder having the formula: $Ba_4Cu_2PtO_x$. The setter powder is placed on the substrate, for example MgO, on which the HTSC material will be grown. The setter powder-covered substrate is then pre-soaked in heptane at 1035° C. for about 16 hours, eliminating moisture from the setter powder. A compact of starting powders is then placed on the layer of setter powder. This assembly is then placed in the furnace for growth.

The setter powder was made by the reaction of Y-123+Pt at 1035° C. The mixtures are first made by suspending Y-123 in heptane. Platinum at 25 wt % is then added to the suspension and the mixed powders are allowed to dry. After drying, the powders are pressed into small pellets. The pellets are heated to 1035° C. and held at that temperature for one hour, the pellets are then rapidly cooled to room temperature. The pellet is ground and the powder is then pressed into a pellet, reheated at 1035° C. for about 17 hours, and then cooled. The quenched pellets were ground into a coarse powder and this powder was used as the bed powder.

The setter powder was used for crystal growth experiments and problems with the nucleation of crystals from the base of samples and with sample adherence to substrates were minimized. Following a crystal growth experiment, the setter powder that did not stick to the bottom of the sample was removed and reused.

A third embodiment of this invention incorporates an isothermal growth method for single crystals; such an approach is more amenable to mass production, a critical consideration in promoting commercialization of the technology for many applications. The ideal isothermal growth temperature would allow for the heterogeneous nucleation of the crystal on a seed while keeping the probability of homogeneous nucleation in the melt to a minimum. The probability of homogeneous nucleation is dependent on the extent of undercooling of the sample (i.e., the difference between the equilibrium solidification temperature and the actual temperature at which the sample is crystallized). For example, within the phase field for Y-123 solidification, decreasing the temperature of the melt would increase the free energy difference between the Y-211+liquid mixture and Y-123. Large undercoolings thus provide a greater driving force for crystallization.

When nuclei begin to form homogeneously in the melt, their stability is decreased by the large number of imperfectly coordinated atoms near the edge of the nucleus compared to the relatively small number of stably coordinated atoms near the center of the nuclei. Small nuclei will be unstable with respect to the melt, but as the nuclei grow larger the boundary effects become less important compared to the free energy change of forming the equilibrium solid phase. The nuclei will thus become stable if they reach some critical size during growth.

Heterogeneous nucleation on a seed with a small lattice mismatch will require a smaller undercooling than is necessary to promote homogeneous nucleation because the seed provides appropriate order to the liquid and there will be fewer unstably coordinated atoms in small nuclei. As an example, the lattice mismatch between Y-123 and Sm-123 is about 1%, the Y-123 should form a nearly epitaxial layer over a Sm-123 seed, resulting in a very low lattice strain. The energy difference between the heterogeneous nucleation process and homogeneous nucleation of Y-123 in the melt should therefore be significant, and it should be possible to find a range of temperatures where heterogeneous nucleation takes place but the rate of homogeneous nucleation is very small. 1008° C. evidently represents an upper limit of the desired temperature range for Y-123.

For proper implementation of the isothermal growth process, a furnace must first be calibrated for the process. This calibration is performed individually for each furnace used and then again for each compact size and powder composition, as the calibration results will differ for different compacts. The calibration process is used to determine the isothermal hold temperature for crystal growth. A compact of the desired size and composition is prepared and placed in the furnace to be calibrated. The compact is then heated to about 5° C. to about 25° C., preferably about 25° C., above the peritectic temperature of the powders in the compact and held at this temperature for about 15 minutes to about 1 hour, preferably about 1 hour. The sample is then cooled at a rate of about 0.2° C./hour to about 1.0° C./hour, preferably from about 0.5° C./hour to 0.7° C./hour. During the cooling process the sample is monitored by a video camera. The video camera must be capable of high contrast expansion, preferably a Dage nuvicon or plubicon. The cooling process is then monitored and observed to determine when crystallization begins. This temperature, the crystallization initialization temperature, is then used as the holding temperature for the calibrated furnace when growing crystals incorporating the starting products in the size compact used in the calibration process. A preferred monitoring method uses a recording means for preserving the monitoring on video tape to allow for "time-shifted" observation. The recording means must be capable of providing enough information to determine the temperature at which crystallization in the sample commences. This can range from simple elapsed time indication—where the temperature is then calculated based on the cooling rate—or may incorporate a means of recording the furnace temperature on the video tape itself. One such recording means is a dedicated time lapse video recorder which includes an elapsed time reference and allows the user to set the period, for example from 2 to 48 hours, for which recording will take place. Changes in the furnace, the make up of starting powders, or the size of the compact require new calibration. The crystallization initialization temperature determined by the calibration designates the upper range of the holding temperature and can vary plus or minus 5° C.

The isothermal growth process also incorporates monitoring to determine the actual hold time. The temperature in the furnace is held at the crystallization initialization temperature until it is determined by monitoring that the crystal has fully formed. A preferred method of monitoring uses an optical monitoring, preferably via video camera. Thus, a video camera can be set up for the calibration step and left in position for crystal growth monitoring. Precise determination of crystal growth completion is not as important. Extra time, up to 48 hours, at the crystallization initialization temperature will not effect crystal growth, whereas premature cooling from the crystallization initialization temperature will result in incomplete growth of the HTSC crystal.

A number of samples were prepared using various combinations of the novel embodiments of this invention. Some of these are illustrated in the following examples. These samples are provided for illistration only, and are not a limitation on the scope of the invention.

EXAMPLE 1

Preparation of YBCO Powders

Process batches calculated to produce stoichiometric 123 and 211 YBCO compositions after calcining, as well as composite two-phase 123/211 materials containing up to 16 wt % excess 211, both with and without additions of platinum in various forms, were prepared using the following raw materials:

| | |
|---|---|
| $Y_2O_3$: | 99.99% yttrium oxide |
| $Ba(NO_3)_2$: | ACS grade |
| CuO: | ACS grade |
| $HNO_3$: | 70% by wt, electronic grade |
| Pt metal: | 0.2–0.45 micron particle size, 99.9% Pt |
| $PtO_2$ hydrate: | <I micron particle size, 99–9% $PtO_2$ hydrate |
| $PtCl_2$ solution: | 1 mg/ml in 20% HCl solution |
| Sucrose: | Carbohydrate fuel |

A) Solution Preparation: Solutions were prepared by digesting the batched raw materials in a mixture of nitric acid ($HNO_3$) and water. The solution was stirred until all of the main constituents were fully dissolved and present as cations in solution. for solutions containing platinum added in an insoluble powder form as Pt metal or $PtO_2$ hydrate, the powders were dispersed by mixing for a period of at least 12 hours prior to spray drying. Solutions containing Pt were added as a soluble salt ($PtCl_2$) and the required platinum addition was made in liquid form. After all of the metallic constituents were completely digested or dispersed, the carbohydrate fuel was added and dissolved. The solutions were then diluted to a standard concentration of 0.4M based on the total dissolved metal cation content, or to half the standard concentration for some batches to evaluate any effects of such a change in concentration on certain characteristics of the powders produced. In solutions containing either excess nitrates or carbohydrates—additional batch variations made to evaluate the effects on powder characteristics—the total dissolved metal concentration was always 0.2M, half the standard concentration. This concentration was dictated by the limited solubility of barium in the presence of excess nitrate ion. Batches having the following solution variations were formulated and used in subsequent powder preparation experiments: (1) solution concentrations of 0.4M (the standard) and 0.2M, (2) $HNO_3$ oxidizer content at standard and 2× standard amounts, and (3) carbohydrate fuel at standard and 2× standard amounts. Solutions containing Pt additions had Pt contents of 0.1%, 0.5%, or 1.0% by weight.

B) Spray Pyrolysis: Following solution preparation and mixing, the liquid was spray pyrolyzed in a commercial spray dryer. Solution atomization was accomplished using an air driven rotary atomizer with a solution feed rate of 4 liters/hour. During this step, the atomized droplets are rapidly dehydrated in a large chamber continuously fed with heated dry air; dryer inlet temperature ranged from 295°–310° C. The dehydrated granules that form (typically 10 60 microns in diameter) are entrained in the hot air stream and subsequently dispersed in a cyclone separator. The dispersed powder is then routed into a furnace operating at 350° C. to induce combustion of the fuel; promote initial reaction of the powders to form oxide, carbonate, and nitrate phases; and induce particle fragmentation. The only process parameter varied in this step was the atomizer air pressure: values of 5.1 kg/cm 2 (standard pressure and atomizer maximum capability) and 4.0 kg/cm$^2$ were used.

C) Calcination: The precursor powders recovered from the spray dryer were placed in MgO trays and calcined in a small box furnace (Lindberg, Model 51828) at a temperature of about 940° C. for 6 hours to produce fully reacted YBCO materials. For all of the batches produced the powder mass per tray was held constant.

D) Milling: Calcined powders were ball milled using polyethylene jars and stabilized zirconia milling media. Milling time was 12 hours for all of the powders, and mill powder loads were held constant in all cases.

The resulting powders were characterized after spray pyrolysis, after calcining, and after milling using standard X-ray diffraction analysis, scanning electron microscopy (JEOL Model 5200), and BET surface area measurements (Quantichrome Quantisorbe QS-10). Selected YBCO powders were subsequently used in single crystal experiments.

Characterization of the various powders at the same three stages of formation using standard XRD analysis provided analogous results. For all of the powders, XRD characterization data revealed the main byproducts of the reactions occurring during spray drying to be $Y_2O_3$, $BaCO_3$, and CuO, together with lesser amounts of $Ba(NO_3)_2$. No significant variations in the intensities of individual peaks attributable to the imposed process variations were noted. After calcining, only the desired HTSC oxide phases were detected (123 or 211 in single phase powders, and both 123 and 211 phases in composite powders).

Examination of the appearance of a composite 123/211 composition (7% excess 211 by weight) containing 1.0 wt % platinum added to the batch solution as metal powder shows particles which are individual oxide, carbonate, or nitrate grains that typify the initial reaction products of the CSP process. Numerous small (up to about 20 microns in diameter) unexploded spherical granules formed during the spray drying process were evident. The irregular particles comprising most of the material are the byproducts of combustion-induced fragmentation of the many other, larger spherical granules that formed during droplet dehydration. In the examination of a similar composite powder (15% excess 211 by weight; 1.0 wt % platinum introduced as $PtO_2$ hydrate) after calcining (940° C., 6 hours) all of the spherical granules have disintegrated during the calcining reactions to form the desired 123 and 211 oxide phases. The individual particles appear to be smaller than about 5 microns, but clustered as hard agglomerates. After milling, most of these agglomerates are reduced to individual 123 and particles ranging from sub-micron size to a few microns.

EXAMPLE 2

Setter Powders

Three setter powders were made. The three powders consisted of 123+25 wt % Pt with no added 211, 123+10 wt % Pt with no added 211, and 123+7 wt % 211+10 wt % Pt. The powders were pressed into pellets, heated to 1035° C. for one hour, cooled, and then ground back into powders. The reground powders were placed back in the furnace and heated to 1035° C. again for approximately 17 hours. Crystal samples were processed using the 25 wt % Pt with no 211, 10 wt % Pt with no 211, and 10 wt % Pt+7 wt % 211 setter powders. No crystals grew from the bottom of samples using the 25 wt % Pt with no 211 powder and the crystal did not stick to the substrate, while crystal did grow from the bottom of samples using the 10-% Pt with no 211 powder and samples using the 10 wt % Pt and 7 wt % 211 powder stuck to the substrate.

EXAMPLE 3

Sm-123 Crystal Seed

Sm-123 seed crystals, used for growing YBCO crystals, were prepared by pressing Sm 123 powder into pellets. Sm-123 pellets were loaded into a horizontal tube furnace. The pellets were heated at 2° C./min to 1085° C. and held for one hour. Pellets were then cooled at 0.02° C./min to 1040° C. to form Sm-123 seeds crystal.

EXAMPLE 4

Single Crystal Growth

The YBCO powders were formed into cylindrical compacts by pouring approximately 25 grams of starting material into a 1-inch steel die and lightly compressing it by hand. A small Sm-123 crystal was then placed in the center of the compact and pressed into the soft powder until it was flush with the top surface. The seeded compact was subsequently pressed to 19,000 psi in a Carver uniaxial hand press, then further compacted at a pressure of 30,000 psi using a cold isostatic press. The compact was then placed on a relatively inert MgO substrate to protect it from contamination during the crystal growth process; an additional barrier to contamination was provided using a setter powder consisting of coarse (>0.5 mm) powder. This layer also facilitated removal of the sample from the substrate after the growth process was completed.

The MgO substrate was placed on a circular porous alumina base plate and suspended in a vertically oriented tube furnace (Lindberg Model 51314; 3-inch diameter) using nickelchromium wires. Two different melt processes were then employed to grow 123 single crystals: (1) a slow-cooling, temperature-gradient process, and (2) an isothermal growth process. For the temperature-gradient process, the sample was heated in the tube furnace at a rate of 2° C./min to a maximum temperature of 1035° C. After holding at 1035° C. for one hour to ensure the complete incongruent melting of the 123 material, the sample was slowly cooled at a rate of 0.01' C./min to a temperature of 950° C. The cooling rate was then increased to 2° C./min for cooling to room temperature. An initially similar schedule was followed for the isothermal process. However, on cooling from 1035° C., the slow cooling was terminated at temperatures of 1008° C., 990° C., 980° C., and 970° C. and held at the chosen temperature for 24 to 60 hours. Following this isothermal hold, slow cooling at a rate of 0.01' C./min was continued until the sample temperature reached 950° C.; subsequent cooling to room temperature was at the faster rate of 2° C./min.

EXAMPLE 5

Isothermal Growth

A furnace (Lindberg Model 51314; 3-inch diameter) was calibrated for the growth of YBCO crystals. The crystalization initiation tempeature was determined to be 1008° C. A YBCO sample was held at 1008° C. for 24 hours. and a crystal began to grow a the center of the sample but did not grow completely. Another sample was held at 1008° C. for 48 hours, but the crystal still did not grow completely. Additonal growing crystals were monitored with a video camera and the cooling step did not begin until the single crystal had fully formed. Samples were processed and monitored and the central crystal grew to the full dimensions of the sample. Monitoring was performed using a 1175 mm shallow watch glass (Fischer) and a cold mirror (for reflecting VIS and transmitting IR) (Edmund Scientific). The watch glass should be replaced due to BaX coating after the 1035° C. hold. A Dage video camera with a nuvicom or plubicon tube was used to observe the samples. Crystal growth begins near 1008° C. and the sample is held between 1008° and 1003° C. until the crystal is fully grown.

EXAMPLE 6

Liquid Loss

Liquid losses from powder samples containing different levels of platinum (0, 0.1, 0.5, and 1.0 wt %) were measured by comparing the mass of quenched samples with the pre-melt values. The samples were quenched following four different treatments at temperatures above the Y-123 peritectic temperature (~1010° C.). The first quench was after heating for 5 min at 1035° C. the homogenization temperature used for crystal growth experiments. The second quench was made after an isothermal dwell at 1035° C. for 1 hour. The final two quenches were made after cooling from 1035° C. for 1000 and 2000 minutes at a rate of 0.01° C./min, which gave quench temperatures of 1025° C. and 1015° C., respectively.

Results of these experiments showed that the rate at which the barium cuprate liquid is lost from the samples is dependent on the concentration of platinum in the sample. For samples containing 0 or 0.1 wt % Pt, liquid losses were found to occur rapidly after reaching the 123 peritectic temperature. The initial rate of weight loss for these samples was 0.45% per minute; at this rate, more than 25% of the sample mass would be lost in one hour. For samples containing 0.5 wt % Pt, however, a much lower initial liquid-loss rate of 0.1% per minute was observed. Measurement of the initial liquid loss rate for samples containing 1 wt % Pt was not made, but a further reduction in the rate seems likely.

Additional liquid-loss experiments made using platinum containing powders produced by the CSP process showed a dramatic advantage compared to mechanically mixed materials in this regard. For the solution-mixed CSP powders, a significantly lower liquid losses were observed over the same range of Pt additions. In a series of experiments made using solution-mixed composite CSP powders containing 7 wt % excess 211 and 1.0 wt % platinum (added as the metal or $PtO_2$ hydrate), the total sample weight lost during processing was found to be between 4% and 8%, which is much lower than the corresponding 30% loss associated noted with mechanically mixed powders. Using improved precursor powders fabricated by the CSP process, liquid losses have been reduced dramatically compared to losses occurring during crystal growth from powders prepared by mechanical mixing.

EBMA analysis of samples quenched from 1035° C. shows that once the platinum-doped samples pass the 123 peritectic temperature, $Ba_4Cu_2PtO_x$, becomes the major platinum-bearing, phase and very little $Ba_{2.6}CuPtO_x$ or $Y_2Ba_3Cu_2PtO_{10}$ can be identified. DTA evidence for the conversion of $Ba_{2.6}CuPtO_x$ and $Y_2Ba_3CU_2PtO_{10}$ to $Ba_4Cu_2PtO_x$ is obscured by the 123 melting peak. As the samples are cooled back below the 123 peritectic temperature and the 123 crystal starts to grow, it traps Pt—Ba rich particles as well as 211 particles. The final single crystal will thus consist of a 123 matrix containing 211 and Pt—Ba rich inclusions. The Pt—Ba rich inclusions in the 123 crystals mostly consist of $Ba_4CU_2PtO_x$, but small amounts of $Ba_{2.6}CuPtO_x$, and $Y_2Ba_3CU_2PtO_{10}$ are also present. As the melt is cooled and $Ba_4CU_2PtO_x$ comes into contact with solidifying 123, the reverse of the $Ba_4CU_2PtO_x$-forming reaction may occur. This would account for the presence of $Ba_{2.6}CuPtO_x$, and $Y_2Ba_3Cu_2PtO_{10}$ in the trapped platinum-bearing inclusions. EBMA data collected from 123 CSP crystal growth samples indicate that in addition to large platinum-rich inclusions in the 123 matrix, both 123 and 211 particles also contain trace amounts of platinum.

EXAMPLE 7

Magnetization Properties

A measured magnetization hysteresis loop for a YBCO-123 single crystal sample containing 0.1 wt % platinum was determined. The large magnetic fields (up to 5 T) used in the measurements and the high magnetization of the sample (up to 800 emu/cm3) exerted torques on the small crystal specimen that were large enough to fracture the plastic sample holder and allow the sample to rotate during the measurements.

Although this rotation (may have) caused anomalous results at high sample magnetization, the results obtained in applied fields above 2 T were reproducible. Estimates of the critical current densities (Jc) in the small samples were made by applying Bean's theory[32] to the magnetization measurements. Critical current densities of over 20,000 A/cm$^2$ were calculated for fields up to 4 T. Thus, the existence of Pt—Ba rich inclusions does not appear to have adversely effected the superconducting properties of the 123 matrix. In fact, the sample maintains a high magnetization level even in large applied fields.

All embodiments of the invention may be incorporated individually or in combination in the HTSC growth process A preferred improved HTSC growth process incorporates all three embodiments in combination, producing vast improvements in HTSC products produced by earlier processes and especially in the growth of single crystal HTSC products.

What is claimed:

1. A process for the production of a single crystal of a high temperature superconductive composition comprising the steps of:
    A) melting a mixture comprised of ceramic powders and a source of Pt;
    B) cooling the molten mixture to the crystallization initialization temperature; and,
    C) maintaining the temperature of the mixture at the crystallization initialization temperature until crystal growth is complete.

2. The process of claim 1 wherein the high temperature superconductive composition has the formula:

$$MBa_2Cu_3O_{7-x}$$

wherein M is selected from the group consisting of Y, Sm, Eu, Gd, Dy, Ho, Er, and Yb; and, x has a number value from about 0.1 to about 1.0.

3. The process of claim 2 wherein said mixture is comprised of $MBa_2Cu_3O_{7-x}$, $M_2BaCuO_5$, and a source of Pt.

4. The process of claim 1 wherein the cooling rate of step B) is 0.1° C./minute.

5. The process of claim 1 wherein the crystallization initialization temperature is determined by an initial calibration of the individual furnace in which the crystal growth will be carried out, said calibration comprising the steps of;
    i) melting a mixture of the type which will be used to grow the crystal;
    ii) cooling said mixture at a rate of 0.01° C./minute; and,
    iii) monitoring said mixture to determine the temperature at which crystallization begins.

6. The process of claim 5 wherein said monitoring is performed by optical observation.

7. The process of claim 1 wherein the point of crystal growth completion is determined through optical observation of the crystal.

8. The process of claim 1 wherein the source of platinum is platinum metal or platinum oxide.

9. A bulk high temperature superconductive composition comprising a single crystal having a formula:

$$MBa_2Cu_3O_{7-x}$$

wherein
    M is selected from the group consisting of Y, Sm, Eu, Gd, Dy, Ho, Er, and Yb; and,
    x has a number value from about 0.1 to about 1.0;
said single crystal being formed by cooling a molten sample to the crystallization initialization temperature and maintaining said molten sample at a temperature at which crystal growth occurs until crystal growth is complete.

10. A process for growing a single crystal, high temperature superconductive composition, wherein the single crystal is melt grown from a starting mixture on a substrate, wherein said starting mixture is placed on a layer of a setter powder deposited on the substrate, said setter powder having the formula $Ba_4Cu_2PtO_x$.

11. The process of claim 1 wherein said crystal is grown on a setter powder having the formula $Ba_4Cu_2PtO_x$.

12. The process of claim 2 wherein said crystal is grown on a setter powder having the formula $Ba_4Cu_2PtO_x$.

13. A process for producing a single crystal of a high temperature superconductive composition of the formula $$MBa_2Cu_3O_{7-x}$$

where M is selected from the group consisting of Y, Sm, Eu, Gd, Dy, Ho, Er, and Yb; and, x has a number value from about 0.1 to about 1.0; comprising the steps of:

A) melting a mixture comprised of ceramic powders and a source of Pt;

B) cooling the molten mixture to form a single crystal;

wherein the mixture of step A) comprises a powder comprising $MBa_2Cu_3O_7$, particles, $M_2BaCuO_5$ particles and platinum particles, where M is selected from the group consisting of Y, Sm, Eu, Gd, Dy, Ho, Er, and Yb; said powder being produced by combustion spray pyrolysis.

14. The process of claim 13 wherein said combustion spray pyrolysis process comprises the steps of:

a) atomizing into fine droplets a solution containing stoichiometric amounts of sources of Ba, Cu, a lanthanide, a source of platinum, and an organic fuel;

b) rapidly dehydrating the droplets in a hot spray dryer chamber, where said organic fuel is spontaneously ignited providing the energy necessary for converting the metals to their respective oxides while preserving the intimate mixing of the solution;

c) calcining the resulting fine particles to yield the desired powder product.

15. The process of claim 13 wherein the solution comprises sources of yttrium, barium, copper, platinum, and an organic fuel.

* * * * *